US011335795B2

(12) United States Patent
Mitsuzuka et al.

(10) Patent No.: US 11,335,795 B2
(45) Date of Patent: May 17, 2022

(54) REVERSE-CONDUCTING IGBT AND MANUFACTURING METHOD THEREOF

(71) Applicant: FUJI ELECTRIC CO., LTD., Kanagawa (JP)

(72) Inventors: Kaname Mitsuzuka, Matsumoto (JP); Misaki Takahashi, Matsumoto (JP); Tohru Shirakawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 12 days.

(21) Appl. No.: 16/693,369

(22) Filed: Nov. 24, 2019

(65) Prior Publication Data

US 2020/0091329 A1 Mar. 19, 2020

Related U.S. Application Data

(63) Continuation of application No. PCT/JP2018/039786, filed on Oct. 25, 2018.

(30) Foreign Application Priority Data

Dec. 14, 2017 (JP) .............................. JP2017-239503

(51) Int. Cl.
*H01L 29/739* (2006.01)
*H01L 29/08* (2006.01)
(Continued)

(52) U.S. Cl.
CPC ...... *H01L 29/7397* (2013.01); *H01L 29/0834* (2013.01); *H01L 29/6609* (2013.01);
(Continued)

(58) Field of Classification Search
CPC ............ H01L 29/7397; H01L 29/0834; H01L 29/861; H01L 29/6609; H01L 29/66348; H01L 21/26513; H01L 21/266
(Continued)

(56) References Cited

U.S. PATENT DOCUMENTS

2012/0132955 A1* 5/2012 Saito .................. H01L 29/7397
257/140
2013/0248924 A1 9/2013 Matsudai
(Continued)

FOREIGN PATENT DOCUMENTS

JP 2013201237 A 10/2013
JP 2015106695 A 6/2015
(Continued)

OTHER PUBLICATIONS

International Search Report and (ISA/237) Written Opinion of the International Search Authority for International Patent Application No. PCT/JP2018/039786, mailed by the Japan Patent Office dated Dec. 25, 2018.

(Continued)

*Primary Examiner* — Robert T Huber

(57) ABSTRACT

To provide a semiconductor device having excellent conduction characteristics of a transistor portion and a diode portion. The semiconductor device having a transistor portion and a diode portion, the semiconductor device includes: a drift region of a first conductivity type provided on a semiconductor substrate, a first well region of a second conductivity type provided on an upper surface side of the semiconductor substrate, an anode region of the second conductivity provided on the upper surface side of the semiconductor substrate, in the diode portion, and a first high concentration region of a second conductivity type which is provided in contact with a first well region between the anode region and the first well region, and has a higher doping concentration than the anode region.

14 Claims, 10 Drawing Sheets

(51) Int. Cl.
  *H01L 29/66* (2006.01)
  *H01L 29/861* (2006.01)
  *H01L 21/225* (2006.01)
  *H01L 21/265* (2006.01)
  *H01L 21/266* (2006.01)

(52) U.S. Cl.
  CPC ...... *H01L 29/66348* (2013.01); *H01L 29/861* (2013.01); *H01L 21/2253* (2013.01); *H01L 21/266* (2013.01); *H01L 21/26513* (2013.01)

(58) Field of Classification Search
  USPC .................................................. 257/140, 577
  See application file for complete search history.

(56) References Cited

U.S. PATENT DOCUMENTS

| 2017/0069625 | A1* | 3/2017 | Hirabayashi ...... H01L 21/26513 |
| 2017/0077217 | A1 | 3/2017 | Ogawa |
| 2017/0162560 | A1 | 6/2017 | Takahashi |
| 2017/0236926 | A1* | 8/2017 | Imagawa ............ H01L 29/0696 257/144 |

FOREIGN PATENT DOCUMENTS

| JP | 2017059662 A | 3/2017 |
| JP | 2017168829 A | 9/2017 |
| WO | 2016030966 A1 | 3/2016 |

OTHER PUBLICATIONS

Ryohei Gejo et al., "High Switching Speed Trench Diode for 1200V RC-IGBT Based on the Concept of Schottky Controlled Injection (SC)", Proceedings of the 2016 28th International Symposium on Power Semiconductor Devices and ICs (ISPSD), Jun. 12-16, 2016, pp. 155-158, Prague, Czech Republic.

Office Action issued for counterpart Japanese Application No. 2019-558953, issued by the Japan Patent Office dated Jul. 21, 2020 (drafted on Jul. 14, 2020).

* cited by examiner

REVERSE-CONDUCTING IGBT AND MANUFACTURING METHOD THEREOF

The contents of the following Japanese patent application are incorporated herein by reference:
 No. 2017-239503 filed in JP on Dec. 14, 2017
 PCT/JP2018/039786 filed on Oct. 25, 2018

BACKGROUND

1. Technical Field

The present invention relates to a semiconductor device and manufacturing method thereof.

2. Related Art

Conventionally, RC-IGBTs having a transistor portion and a diode portion are known. In paragraph 0015 of Patent Literature 1, for example, it is described that "the impurity concentration of an anode layer 40 is lower than the impurity concentration of a base region 14 and lower than the impurity concentration of the P+ contact region 18".

Patent Literature International publication no. 2016/030966

In the RC-IGBT, it is preferable to improve the conduction characteristics of the transistor portion and the diode portion.

GENERAL DISCLOSURE

In the first mode of the present invention, a semiconductor device having a transistor portion and a diode portion, the semiconductor device comprising:
 a drift region of a first conductivity type provided in a semiconductor substrate;
 a first well region of a second conductivity type provided on an upper surface side of the semiconductor substrate;
 an anode region of a second conductivity type provided in the diode portion, at the upper surface side of the semiconductor substrate in the diode portion; and
 a first high concentration region of a second conductivity type provided in contact with the first well region between the anode region and the first well region, and having a higher doping concentration than the anode region.

The transistor portion may have a base region of a second conductivity type provided on the upper surface side of the semiconductor substrate. The doping concentration of the anode region may be lower than the doping concentration of the base region.

The doping concentration of the first high concentration region may be same as the doping concentration of the base region.

The semiconductor device may further include an interlayer dielectric film provided above the upper surface of the semiconductor substrate and an emitter electrode provided above the interlayer dielectric film. The interlayer dielectric film is provided with one or more contact holes to electrically connect the emitter electrode and the semiconductor substrate, the one or more contact holes are provided extending in the extending direction of a plurality of trench portions included in the transistor portion, and a space between the anode region and the first high-concentration region may be positioned outside the end portion in the extending direction of one or more contact holes in the diode portion in the extending direction in plane view.

The semiconductor device may further include an interlayer dielectric film provided above the upper surface of the semiconductor substrate and an emitter electrode provided above the interlayer dielectric film. The interlayer dielectric film is provided with one or more contact holes to electrically connect the emitter electrode and the semiconductor substrate, the one or more contact holes are provided extending in the extending direction of the plurality of trench portions of the transistor portion, and a space between the anode region and the first high concentration region may be located at a same position as the end portion of the one or more contact holes in the extending direction in the diode portion in the extending direction in plane view.

The semiconductor device may further include an interlayer dielectric film provided above the upper surface of the semiconductor substrate and an emitter electrode provided above the interlayer dielectric film. The interlayer dielectric film is provided with one or more contact holes to electrically connect the emitter electrode and the semiconductor substrate, the one or more contact holes are provided extending in the extending direction of the plurality of trench portions of the transistor portion, and a space between the anode region and the first high concentration region may be positioned inside the extending direction end of one or more contact holes in the diode portion in the extending direction in plane view.

The diode portion may include a cathode region provided on a lower surface side of the semiconductor substrate. The space between the anode region and the first high concentration region may be located outside the cathode region in the extending direction in plane view of the plurality of trench portions.

The diode portion may include a cathode region provided on a lower surface side of the semiconductor substrate. The space between the anode region and the first high concentration region may be located at a same position as an end portion of the cathode region in the extending direction in plane view of a plurality of trench portions.

The transistor portion may include a collector region provided on a lower surface side of the semiconductor substrate. The diode portion may include a cathode region provided on the lower surface side of the semiconductor substrate. The anode region may have an end portion at a same position as a boundary between the cathode region and the collector region in an arrangement direction of a plurality of trench portions of the transistor portion in plane view.

The transistor portion may include a collector region provided on a lower surface side of the semiconductor substrate. The anode region may extend from the diode portion to a region where the collector region is provided in plane view.

The semiconductor device may further include one or more transistor portions, one or more diode portions, a second well region of a second conductive type provided on the upper surface of the semiconductor substrate between any of the one or more transistor portions and one or more diode portions, and a second high concentration region of a second conductivity type provided in contact with the second well region and having a higher doping concentration than the anode region.

The second high concentration region may have a same doping concentration as the first high concentration region.

In the second mode of the present invention, a manufacturing method of a semiconductor device having a transistor portion and a diode portion, the method comprising:
 forming a drift region of a first conductivity type in a semiconductor substrate;

providing a first well region of a second conductivity type closer to an upper surface of the semiconductor substrate than a drift region;

providing, in the diode portion, an anode region of a second conductivity type at an upper surface side of the semiconductor substrate; and providing a first high concentration region of a second conductivity type having a higher doping concentration than the anode region, the first high concentration region being in direct contact with the first well region, between the anode region and the first well region.

Providing the first high concentration region may include implanting a dopant into the semiconductor substrate while masking a region where the anode region is provided.

The summary clause does not necessarily describe all necessary features of the embodiments of the present invention. The present invention may also be a sub-combination of the features described above.

DESCRIPTION OF EXEMPLARY EMBODIMENTS

Figure 1A:
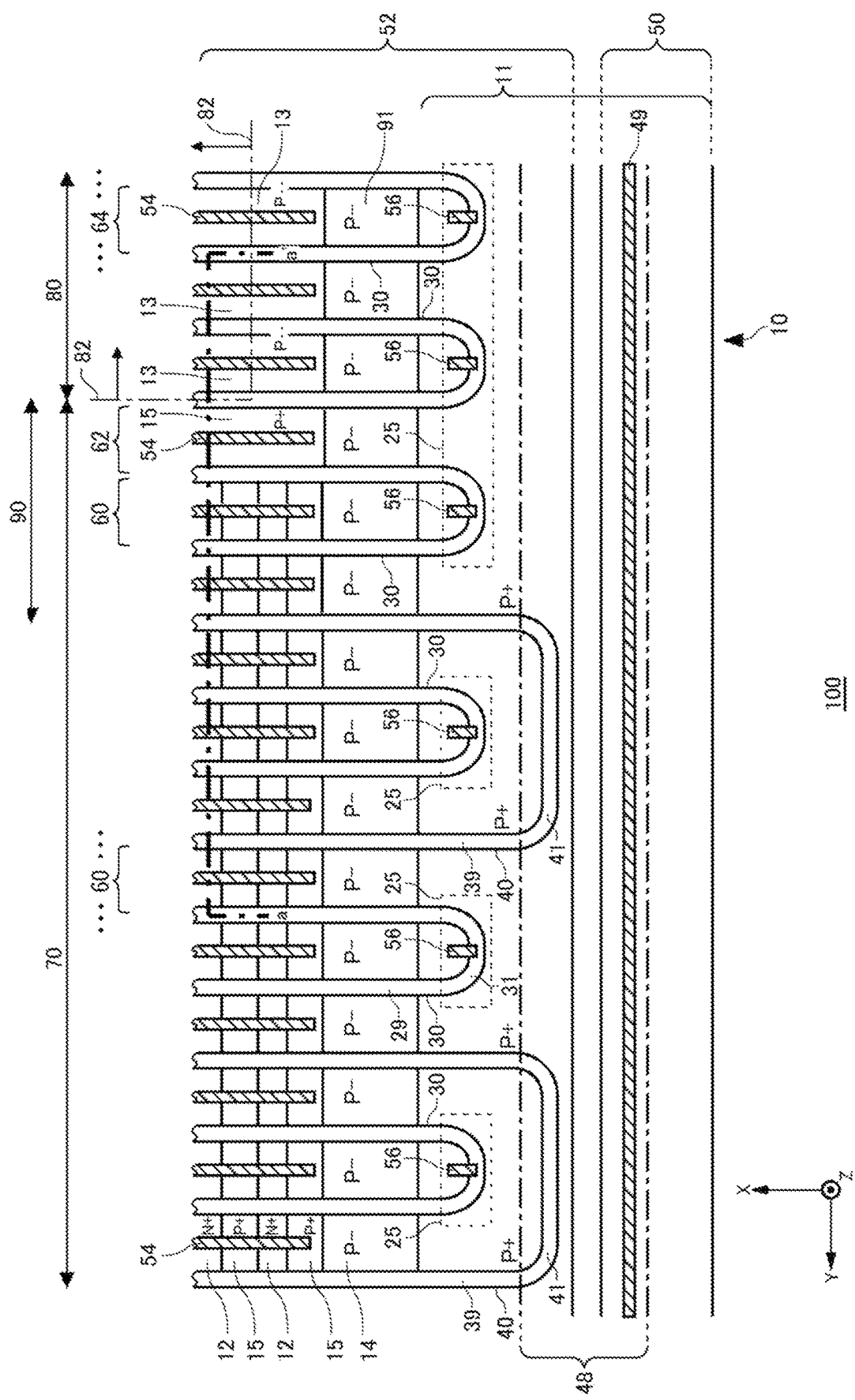
FIG. 1A is an example of a top view of a semiconductor device 100 according to a first embodiment.

Hereinafter, the present invention will be described through embodiments of the invention, but the following embodiments do not limit the invention according to the claims. In addition, not all the combinations of features described in the embodiments are essential for the solving means of the invention.

In the present specification, one side in a direction parallel to the depth direction of the semiconductor substrate is referred to as "upper" and the other side is referred to as "lower". One surface is referred to as the upper surface and the other surface is referred to as the lower surface, of the two principal surfaces of the substrate, the layer or the other member. The directions of "upper", "lower", "front", and "back" are not limited to the direction of gravity or the direction of mounting on a substrate or the like when the semiconductor device is mounted.

In this description, technical matters may be described using orthogonal coordinate axes of the X axis, the Y axis, and the Z-axis. In this description, a plane parallel to the upper surface of the semiconductor substrate is defined as an XY plane, and a depth direction of the semiconductor substrate is defined as a Z axis. In this description, the case where the semiconductor substrate is viewed in the Z-axis direction is referred to as a plain view.

In each embodiment, the first conductivity type is an N type, and the second conductivity type is a P type; however, the first conductivity type may be a P type and the second conductivity type may be an N type. In this case, the conductivity types of the substrates, layers, regions, etc. in the respective embodiments respectively have opposite polarities.

In this description, it means that electrons or holes are majority carriers in layers or regions titled with n or p, respectively. Further, + and − attached to n and p mean that the doping concentration is higher and lower than the layer or region to which it is not attached, respectively, and ++ is higher doping concentration than +, −− is lower doping concentration than −.

In this description, the doping concentration refers to the concentration of a donor or an acceptor-converted dopant. Therefore, the unit is /cm$^3$. In this description, the concentration difference between the donor and the acceptor (that is, net doping concentration) may be used as the doping concentration. In this case, the doping concentration can be measured by an SR method. The chemical concentration of the donor and acceptor may be the doping concentration. In this case, the doping concentration can be measured by a SIMS method. Unless specifically limited, any of the above may be used as the doping concentration. Unless specifically limited, a peak value of the doping concentration distribution in the doping region may be the doping concentration in the doping region.

Further, in this description, the dose amount refers to the number of ions per unit area implanted into a wafer when ion implantation is performed. Therefore, the unit is /cm$^2$. The dose amount of the semiconductor region can be an integrated concentration obtained by integrating the doping concentration over the depth direction of the semiconductor region. The unit of the integrated concentration is /cm$^2$. Therefore, the dose amount and the integrated density may be treated as the same. The integrated concentration may be an integrated value up to the half-width and may be derived by excluding the influence of other semiconductor regions when overlapping with the spectrum of other semiconductor regions.

Therefore, in this description, the level of doping concentration can be read as the level of dose. That is, when the doping concentration of one region is higher than the doping concentration of the other region, it can be understood that the dose amount of the one region is higher than the dose amount of the other region.

FIG. 1A shows one example of a configuration of a semiconductor device 100 according to the first embodiment. The semiconductor device 100 of this example is a semiconductor chip including a transistor portion 70 and a diode portion 80. For example, the semiconductor device 100 is a reverse conducting IGBT (RC-IGBT: Reverse Conducting IGBT).

The transistor portion 70 is a region obtained by projecting a collector region provided on the lower surface side of a semiconductor substrate 10 onto the upper surface of the semiconductor substrate 10. The collector region has a second conductivity type. The collector region of this example is a P+ type as one example. The transistor portion 70 includes a transistor such as the IGBT. The transistor portion 70 includes a boundary portion 90 located at the boundary between the transistor portion 70 and the diode portion 80.

The diode portion 80 may be a region obtained by projecting a cathode region 82 onto the upper surface of the semiconductor substrate 10. The diode portion 80 includes a diode such as a freewheel diode (FWD) provided in direct contact with the transistor portion 70 on the upper surface of the semiconductor substrate 10.

In FIG. 1A, a region around the chip end on the edge side of the semiconductor device 100 is shown, and other regions are omitted. For example, an edge termination structure portion may be provided in the negative region in the X-axis direction of the semiconductor device 100 of this example. The edge termination structure portion alleviates electric field concentration on the upper surface side of the semiconductor substrate 10. The edge termination structure portion has, for example, a guard ring, a field plate, a RESURF, and a combination of these. In this example, for the sake of convenience, the edge on the negative side in the X-axis direction will be described; however, the same applies to other edges of the semiconductor device 100.

The semiconductor substrate 10 may be a silicon substrate, a silicon carbide substrate, or a nitride semiconductor substrate such as a gallium nitride substrate. The semiconductor substrate 10 in this example is a silicon substrate.

The semiconductor device 100 of this example includes a gate trench portion 40, a dummy trench portion 30, a first well region 11, an emitter region 12, an anode region 13, a base region 14, a contact region 15, and a density region 91 on the upper surface of the semiconductor substrate 10. In addition, the semiconductor device 100 of this example includes an emitter electrode 52 and a gate metal layer 50 provided above the upper surface of the semiconductor substrate 10.

The emitter electrode 52 and the gate metal layer 50 are formed of a material containing metal. For example, at least one region of the emitter electrode 52 may be formed of aluminum, an aluminum-silicon alloy, or an aluminum-silicon-copper alloy. At least one region of the gate metal layer 50 may be formed of aluminum, an aluminum-silicon alloy, or an aluminum-silicon-copper alloy. The emitter electrode 52 and the gate metal layer 50 may have a barrier metal formed of titanium, a titanium compound, or the like below a region formed of aluminum or the like. The emitter electrode 52 and the gate metal layer 50 are provided separately from each other.

The emitter electrode 52 and the gate metal layer 50 are provided above the semiconductor substrate 10 with an interlayer dielectric film interposed therebetween. The interlayer dielectric film is omitted in FIG. 1A. A contact hole 49, a contact hole 54, and a contact hole 56 are provided through the interlayer dielectric film.

The contact hole 49 connects the gate metal layer 50 and the gate runner 48. In the contact hole 49, a plug made of tungsten or the like may be formed.

The gate runner 48 connects the gate metal layer 50 and the gate trench portion 40 of the transistor portion 70. In one example, the gate runner 48 is connected to the gate conductive portion in the gate trench portion 40 on the upper surface of the semiconductor substrate 10. The gate runner 48 is not connected to the dummy conductive portion in the dummy trench portion 30. For example, the gate runner 48 is formed of polysilicon doped with impurities.

The gate runner 48 of this example is formed from below the contact hole 49 to the tip of the gate trench portion 40. An insulating film such as an oxide film is formed between the gate runner 48 and the upper surface of the semiconductor substrate 10. The gate conductive portion is exposed at the tip of the gate trench portion 40 on the upper surface of the semiconductor substrate 10. The gate trench portion 40 contacts the gate runner 48 at the exposed portion of the gate conductive portion.

The contact hole 56 connects the emitter electrode 52 and the dummy conductive portion in the dummy trench portion 30. A plug made of tungsten or the like may be formed inside the contact hole 56.

The connecting portion 25 is provided between the emitter electrode 52 and the dummy conductive portion. The connection portion 25 is a conductive material such as polysilicon doped with impurities. Here, the connection portion 25 is polysilicon (N+) doped with N-type impurities. The connection portion 25 is provided above the upper surface of the semiconductor substrate 10 via an insulating film such as an oxide film.

The gate trench portions 40 are arranged at predetermined intervals along a predetermined arrangement direction (Y-axis direction in this example). The gate trench portion 40 of this example may include two extending portions 39 extending in the extending direction (X-axis direction in this example) parallel to the upper surface of the semiconductor substrate 10 and perpendicular to the arrangement direction, and a connecting portion 41 that connects the two extending portions 39.

It is preferable that at least one part of the connection portion 41 is formed in a curved shape. By connecting the ends of the two extended portions 39 of the gate trench portion 40, the electric field concentration at the ends of the extended portion 39 can be reduced. In the connection portion 41 of the gate trench portion 40, the gate runner 48 may be connected to the gate conductive portion.

The dummy trench portions 30 are arranged at predetermined intervals along a predetermined arrangement direction (Y-axis direction in this example), similarly to the gate trench portions 40. The dummy trench portions 30 of this example may have a U shape on the upper surface of the semiconductor substrate 10, similarly to the gate trench portion 40. In other words, the dummy trench portion 30 may include two extending portions 29 extending along the extending direction and a connecting portion 31 connecting the two extending portions 29.

Here, although two dummy trench portions 30 are provided between the gate trench portions 40 in the transistor portion 70, the number and arrangement of the dummy trench portions 30 with respect to the gate trench portion 40 may be appropriately set. Further, the transistor portion 70 may be a so-called full gate structure in which the dummy trench portion 30 is not provided and all trench portions are provided as the gate trench portions 40.

The emitter electrode 52 is formed above the gate trench portion 40, the dummy trench portion 30, the first well region 11, the emitter region 12, the anode region 13, the base region 14, the contact region 15, and the first high concentration region 91.

The first well region 11 is a region of a second conductivity type provided on the upper surface side of the semiconductor substrate 10 with respect to a drift region 18 described later. The first well region 11 is an example of a well region provided on the edge side of the semiconductor device 100. The first well region 11 is a P+ type as an example. The first well region 11 is formed in a predetermined range from the end of the active region on the side where the gate metal layer 50 is provided. The diffusion depth of the first well region 11 may be deeper than the depths of the gate trench portion 40 and the dummy trench portion 30. One region of the gate trench portion 40 and the dummy trench portion 30 on the gate metal layer 50 side is formed in the first well region 11. The bottoms of the ends in the extending direction of the gate trench portion 40 and the dummy trench portion 30 may be covered with the first well region 11.

The contact hole 54 is formed above each region of the emitter region 12 and the contact region 15 in the transistor portion 70. The contact hole 54 is formed above the anode region 13 in the diode portion 80. The contact hole 54 is formed above each region of the emitter region 12 and the contact region 15 at the boundary portion 90. None of the contact holes 54 is provided above the base region 14 and the first well region 11 provided at both ends in the X-axis direction. Thus, one or more contact holes 54 are formed in the interlayer dielectric film. One or more contact holes 54 may be provided extending in the extending direction.

The boundary portion 90 refers to a boundary region between the region where the gate trench portion 40 is arranged at a predetermined pitch in the Y-axis direction and the diode portion 80 among the regions where the collector region is projected onto the upper surface of the semiconductor substrate 10.

A first mesa portion 60, a second mesa portion 62, and a third mesa portion 64 are mesa portions that are provided in direct contact with each trench portion in the Y-axis direction in a surface parallel to the upper surface of the semiconductor substrate 10. The mesa portion is a portion of the semiconductor substrate 10 sandwiched between two adjacent trench portions and may be a portion from the upper surface of the semiconductor substrate 10 to the depth of the deepest bottom of each trench portion. The extended portion of each trench portion may be a single trench portion. That is, a region sandwiched between two extending portions may be a mesa portion.

The first mesa portion 60 is provided in direct contact with at least one of the dummy trench portions 30 and the gate trench portion 40 in the transistor portion 70. Further, the first mesa portion 60 is provided adjacent to the transistor portion 70 at the boundary 90. The first mesa portion 60 includes a first well region 11, an emitter region 12, a base region 14, and a contact region 15 on the upper surface of the semiconductor substrate 10. In the first mesa portion 60, the emitter regions 12 and the contact regions 15 are alternately provided in the extending direction.

The second mesa portion 62 is provided adjacent to the diode portion 80 at the boundary portion 90. The second mesa portion 62 includes the first well region 11, the base region 14, and the contact region 15 on the upper surface of the semiconductor substrate 10. In the boundary portion 90, a region sandwiched between the first mesa portion 60 adjacent to the transistor portion 70 and the second mesa portion 62 adjacent to the diode portion 80 may be any of the first mesa portion 60 and the second mesa portion 62.

The third mesa portion 64 is provided in a region sandwiched between adjacent dummy trench portions 30, in the diode portion 80. The third mesa portion 64 includes a first well region 11, an anode region 13, and a first high concentration region 91 on the upper surface of the semiconductor substrate 10.

The base region 14 is a region of a second conductivity type provided on the upper surface side of the semiconductor substrate 10 in the transistor portion 70. The base region 14 is a P-type as an example. The base region 14 may be provided on both ends of the first mesa portion 60 and the second mesa portion 62 in the X-axis direction on the upper surface of the semiconductor substrate 10. FIG. 1A shows only one end of the base region 14 in the X-axis direction.

The emitter region 12 is provided in contact with the gate trench portion 40 on the upper surface of the first mesa portion 60. The emitter region 12 may be provided in the Y-axis direction from one of the two trench portions to the other, which extend in the X-axis direction and sandwich the first mesa portion 60. The emitter region 12 is also provided below the contact hole 54. In FIG. 1A, the boundary of the emitter region 12 that overlaps the contact hole 54 in plane view is indicated by a broken line.

Further, the emitter region 12 may be in contact with the dummy trench portion 30 or may not be in contact with it. In this example, the emitter region 12 is in contact with the dummy trench portion 30. The emitter region 12 of this example is a first conductivity type. The emitter region 12 of this example is N+ type as an example.

The contact region 15 is a region of a second conductivity type having a higher doping concentration than the base region 14. The contact region 15 of this example is a P+ type as an example. The contact region 15 in this example is provided on the upper surface of the first mesa portion 60. The contact region 15 may be provided in the Y-axis direction from one of the two trench portions to the other, which extend in the X-axis direction and sandwich the first mesa portion 60. The contact region 15 may contact or may not contact the gate trench portion 40. Further, the contact region 15 may contact or may not contact the dummy trench portion 30. In this example, the contact region 15 is in contact with the dummy trench portion 30 and the gate trench portion 40. The contact region 15 is also provided below the contact hole 54. In FIG. 1A, the boundary of the contact region 15 that overlaps the contact hole 54 in plane view is indicated by a broken line.

Further, the contact region 15 is also provided on the upper surface of the second mesa portion 62. The area of the contact region 15 provided on the upper surface of the one second mesa portion 62 is larger than the area of the contact region 15 provided on the upper surface of the one first mesa portion 60. The contact region 15 on the upper surface of the second mesa portion 62 may be provided in the entire region sandwiched between the base regions 14 provided at both ends of the second mesa portion 62 in the X-axis direction.

The anode region 13 is a region of a second conductivity type provided on the upper surface side of the semiconductor substrate 10 with respect to the drift region 18 in the diode portion 80. The anode region 13 is a P−− type as an example. The doping concentration of the anode region 13 is lower than the doping concentration of the base region 14. For example, the anode region 13 has a dose amount of $1.0 \times 10^{13}/\text{cm}^2$ to $2.0 \times 10^{13}/\text{cm}^2$. The dopant in the anode region 13 may be boron.

The anode region 13 in this example is provided on the upper surface of the third mesa portion 64. The anode region 13 is formed in the third mesa portion 64 from one dummy trench portion 30 sandwiching the third mesa portion 64 to the other dummy trench portion 30. That is, on the upper surface of the semiconductor substrate 10, the width of the third mesa portion 64 in the Y-axis direction is equal to the width of the anode region 13 provided in the third mesa portion 64 in the Y-axis direction. Further, the emitter region 12 may be formed in the third mesa portion 64.

The first high concentration region 91 is provided on the upper surface side of the semiconductor substrate 10 with respect to the drift region 18. The first high concentration region 91 is a region of a second conductivity type having a higher doping concentration than the anode region 13. The first high concentration region 91 is P− type as one example. The doping concentration of the first high concentration region 91 may be the same as the doping concentration of the base region 14. That is, the first high concentration region 91 may be formed by a process common to the base region 14. Further, the first high concentration region 91 may have a doping concentration different from that of the base region 14. For example, the dose amount of the first high concentration region 91 is $1.0 \times 10^{13}/cm^2$ to $3.0 \times 10^{13}/cm^2$.

In the X-axis direction, the first high concentration region 91 is provided between the anode region 13 and the first well region 11. The first high concentration region 91 of this example is provided in direct contact with the first well region 11 on the negative side in the X-axis direction. In addition, the first high concentration region 91 is in contact with the anode region 13 on the positive side of the X-axis direction.

Here, the anode region 13 of this example extends from the cathode region 82 to the outside of the cathode region 82 in the extending direction in plane view. As a result, the first high concentration region 91 of this example is in contact with the anode region 13 and the outside of the cathode region 82. The outside of the cathode region 82 refers to a region other than the region where the cathode region 82 is provided in plane view.

The first high concentration region 91 is arranged with the anode region 13 in the extending direction on the upper surface side of the semiconductor substrate 10. The first high concentration region 91 is provided in contact with the anode region 13. However, the first high concentration region 91 may be provided separately from the anode region 13. In this case, a region of a second conductivity type having a doping concentration different from the doping concentration of the anode region 13 and the first high concentration region 91 may be provided between the first high concentration region 91 and the anode region 13.

The first high concentration region 91 of this example is provided on the edge side with respect to the anode region 13 in the diode portion 80. The edge side refers to a region outside the active region where the anode region 13 and the cathode region 82 are provided in the diode portion 80. In this example, the edge side is illustrated as a region on the negative side in the X-axis direction from the active region. For example, the space between the anode region 13 and the first high-concentration region 91 is located outside the end portion of the one or more contact holes 54 in the diode portion 80 in the extending direction in plane view.

The cathode region 82 is a region of a first conductivity type provided on the lower surface side of the semiconductor substrate 10 in the diode portion 80. The cathode region 82 of this example is N+ type as one example. A region where the cathode region 82 is provided in plane view is indicated by alternate long and short dashed lines.

The semiconductor device 100 of this example can suppress deterioration of the carrier extraction efficiency during reverse recovery around the edge even when the doping concentration of the anode region 13 is lowered by providing the first high concentration region 91 on the edge side. Thereby, the deterioration of the reverse recovery tolerance of the semiconductor device 100 can be suppressed.

Further, the semiconductor device 100 may be provided with a killer for controlling the lifetime of carriers in the drift region 18. In the semiconductor device 100 of this example, since the doping concentration of the anode region 13 can be set to a low doping concentration, it is not necessary to set the concentration of the killer provided in the drift region 18 to a high doping concentration.

Figure 1B:
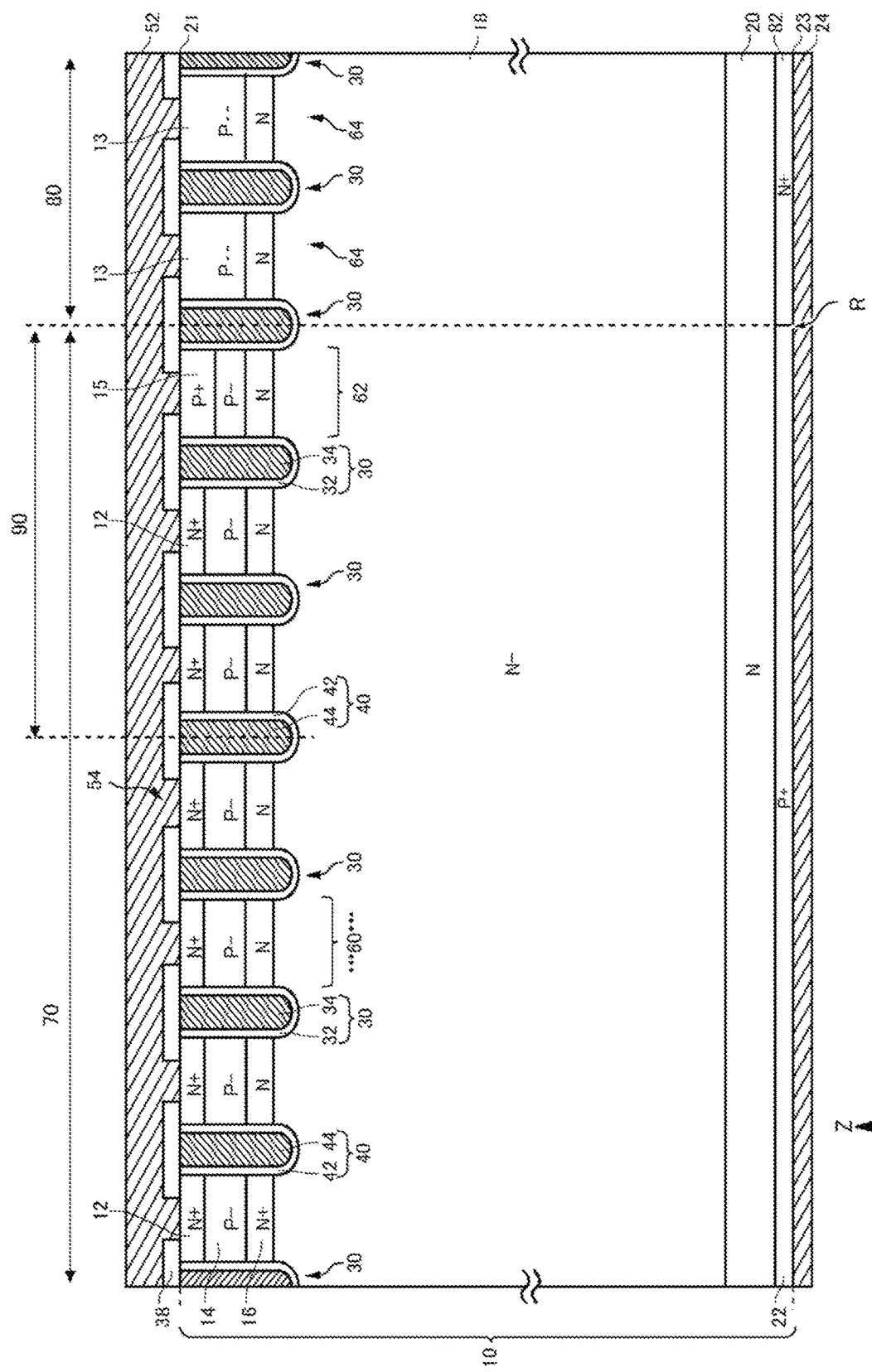
FIG. 1B is an example of an a-a' cross-sectional view of the semiconductor device 100 according to the first embodiment.

FIG. 1B is a diagram showing an example of a cross-section of a-a' in FIG. 1A. The cross-section of a-a' is a YZ plane that passes through the emitter region 12, the contact region 15, and the anode region 13 in the transistor portion 70 and the diode portion 80. The semiconductor device 100 of this example includes the semiconductor substrate 10, the interlayer dielectric film 38, the emitter electrode 52, and the collector electrode 24 in the cross-section of a-a'. The emitter electrode 52 is formed on the upper surface 21 of the semiconductor substrate 10 and the upper surface of the interlayer dielectric film 38.

The drift region 18 is a region of a first conductivity type provided in the semiconductor substrate 10. The drift region 18 in this example is N-type as an example. The drift region 18 may be a region remaining in the semiconductor substrate 10 without forming another doping region. That is, the doping concentration of the drift region 18 may be the doping concentration of the semiconductor substrate 10.

A buffer region 20 is a region of a first conductivity type provided below the drift region 18. The buffer area 20 of this example is N type as an example. The doping concentration of the buffer region 20 is higher than the doping concentration of the drift region 18. The buffer region 20 may function as a field stop layer that prevents a depletion layer extending from the lower surface side of the base region 14 from reaching the collector region 22 of the second conductivity type and the cathode region 82 of the first conductivity type.

The collector region 22 is a region of the second conductivity type provided on the lower surface side of the semiconductor substrate 10 in the transistor portion 70. The collector region 22 is P+ type as an example. The collector region 22 in this example is provided below the buffer region 20.

The cathode region 82 is provided below the buffer region 20 in the diode portion 80. The boundary R is a boundary between the collector region 22 and the cathode region 82. That is, the boundary R indicates the boundary between the transistor portion 70 and the diode portion 80.

The collector electrode 24 is formed on the lower surface 23 of the semiconductor substrate 10. The collector electrode 24 is made of a conductive material such as metal.

Here, the collector region 22 may extend in the Y-axis direction to the region on the lower surface 23 side of the second mesa portion 62. Since the collector region 22 extends to the lower surface 23 of the second mesa portion 62, the distance between the emitter region 12 of the transistor portion 70 and the cathode region 82 of the diode portion 80 can be secured. Further, the distance between the emitter region 12 of the boundary portion 90 and the cathode region 82 of the diode portion 80 can be secured. Therefore, electrons injected into the drift region 18 from the gate structure portion including the emitter region 12 of the transistor portion 70 and the emitter region 12 of the boundary portion 90 can be prevented from flowing out to the cathode region 82 of the diode portion 80.

In this example, the distance between the contact region 15 of the second mesa portion 62 and the cathode region 82 of the diode portion 80 may be increased as compared with the case where the cathode region 82 is provided directly below the second mesa portion 62. Thereby, when the diode portion 80 is conducted, it is possible to suppress to inject of holes from the contact region 15 having a higher doping concentration than the base region 14 into the cathode region 82.

A storage region 16 is a region of the first conductivity type provided above the drift region 18 in the first mesa portion 60, the second mesa portion 62, and the third mesa portion 64. The storage region 16 in this example is N type as an example. The storage region 16 is provided in contact with the gate trench portion 40. The storage region 16 may or may not contact the dummy trench portion 30. The doping concentration of the storage region 16 is higher than the doping concentration of the drift region 18. By providing the storage region 16, carrier injection promoting effect (IE effect) can be enhanced and the on-voltage of the transistor portion 70 can be reduced.

Here, the storage region 16 is provided in the first mesa portion 60, the second mesa portion 62, and the third mesa portion 64, but it may be provided in the first mesa portion 60 and the second mesa portion 62 and may not be provided in the third mesa portion 64, and it may be provided in the first mesa portion 60 and may not be provided in the second mesa portion and the third mesa portion 64.

The base region 14 is a region of the second conductivity type provided above the storage region 16 in the first mesa portion 60 and the second mesa portion 62. The base region 14 is provided in contact with the gate trench portion 40.

The emitter region 12 is provided between the base region 14 and the upper surface 21 in the first mesa portion 60. The emitter region 12 is provided in contact with the gate trench portion 40. The emitter region 12 may or may not contact the dummy trench portion 30. The doping concentration of the emitter region 12 is higher than the doping concentration of the drift region 18. An example of the dopant in the emitter region 12 is arsenic (As). The emitter region 12 may not be provided in the second mesa portion 62.

The contact region 15 is provided above the storage region 16 in the second mesa portion 62. The contact region 15 is provided in contact with the gate trench portion 40 in the second mesa portion 62.

The anode region 13 is provided above the storage region 16 in the third mesa portion 64. The anode region 13 of this example has an end portion at the same position as the boundary between the cathode region 82 and the collector region 22 in the arrangement direction in plane view. That is, the anode region 13 is provided up to the boundary position between the transistor portion 70 and the diode portion 80. For example, when the dummy trench portion 30 is provided at the boundary R, the anode region 13 is provided up to the sidewall of the dummy trench portion 30. Thus, the same position as the boundary between the cathode region 82 and the collector region 22 is not only the case where the end of the anode region 13 completely coincides with the boundary R, but also the case where the end of the anode region 13 does not completely coincide with the boundary R, by providing the dummy trench portion adjacent to the end of the anode region 13 with the boundary R. Further, the anode region 13 may also be provided above the collector region 22.

The one or more gate trench portions 40 and the one or more dummy trench portions 30 are provided on the upper surface 21. Each trench portion is provided from the upper surface 21 to the drift region 18. In the region where at least one of the emitter regions 12, the anode region 13, the base region 14, the contact region 15, and the storage region 16 is provided, each trench portion also penetrates these regions and reaches to the drift region 18. The fact that the trench portion penetrates the doping region is not limited to the one manufactured in the order in which the trench portion is formed after the doping region is formed. What formed the doping region between the trench portion after forming the trench portion is also contained in the thing which a trench portion has penetrated the doping region.

The gate trench portion 40 includes a gate trench formed on the upper surface 21, a gate insulating film 42, and a gate conductive portion 44. The gate insulating film 42 is formed to cover the inner wall of the gate trench. The gate insulating film 42 may be formed by oxidizing or nitriding the semiconductor on the inner wall of the gate trench. The gate conductive portion 44 is formed inside the gate insulating film 42 inside the gate trench. The gate insulating film 42 insulates the gate conductive portion 44 from the semiconductor substrate 10. The gate conductive portion 44 is formed of a conductive material such as polysilicon. The gate trench portion 40 is covered with an interlayer dielectric film 38 on the upper surface 21.

The gate conductive portion 44 includes a region facing the base region 14 adjacent to the first mesa portion 60 side sandwiched with the gate insulating film 42 interposed therebetween in the depth direction of the semiconductor substrate 10. When a predetermined voltage is applied to the gate conductive portion 44, a channel formed of an electron inversion layer is formed on the surface layer in contact with the gate trench of the base region 14.

The dummy trench portion 30 may have the same structure as the gate trench portion 40. The dummy trench portion 30 includes a dummy trench, a dummy insulating film 32 and a dummy conductive portion 34 formed on the upper surface 21 side. The dummy insulating film 32 is formed to cover the inner wall of the dummy trench. The dummy conductive portion 34 is formed inside the dummy trench and is formed inside the dummy insulating film 32. The dummy insulating film 32 insulates the dummy conductive portion 34 from the semiconductor substrate 10. The dummy trench portion 30 is covered with an interlayer dielectric film 38 on the upper surface 21.

The interlayer dielectric film 38 is provided above the upper surface of the semiconductor substrate 10. The interlayer dielectric film 38 is provided with one or more contact holes 54 to electrically connect the emitter region 12 and the semiconductor substrate 10. Similarly, the other contact holes 49 and 54 may be provided through the interlayer dielectric film 38. An emitter electrode 52 is provided above the interlayer dielectric film 38.

Figure 2:
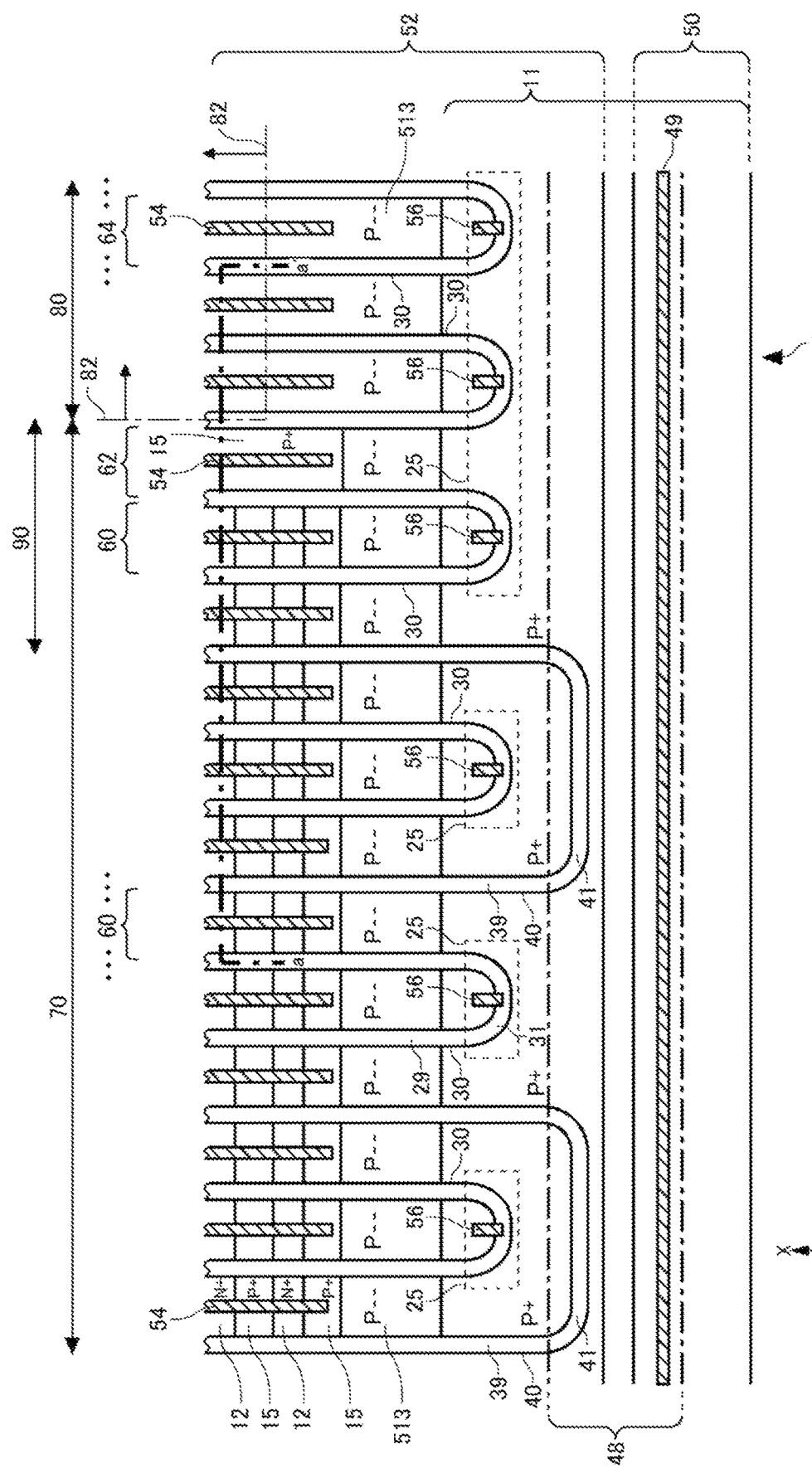
FIG. 2 is an example of a top view of a semiconductor device 500 according to a comparative example.

FIG. 2 is an example of a top view of the semiconductor device 500 according to the comparative example. In the semiconductor device 500 of this example, there are different points that the base region of the transistor portion 70 and the anode region of the diode portion 80 are formed by the P−− type of region 513 of the second conductivity type and the region 513 of the diode portion 80 is formed up to the end portion of the edge side of the diode portion 80 in contact with the first well region 11.

The region 513 of the second conductivity type is provided in the first mesa portion 60, the second mesa portion 62, and the third mesa portion 64. Further, the region 513 of the second conductivity type is formed up to the end portion on the edge side of the transistor portion 70. Therefore, in the semiconductor device 500, the anode region of the diode portion 80 and the region on the edge side of the transistor portion 70 and the diode portion 80 have the same doping concentration. For example, a region 513 of the second conductivity type is provided on the entire surface of the semiconductor substrate 10 by performing ion implantation under the same conditions. Further, the contact region 15 of the transistor portion 70 is provided at a higher doping concentration than the region 513 of the second conductivity type by performing additional ion implantation while masking the region where the region 513 of the second conductivity type is provided. The doping concentration of the region 513 of the second conductivity type also functions as the base region of the transistor portion 70, and thus affects the characteristics of the transistor portion 70.

Here, since the semiconductor device 500 is restricted by a switching loss of the transistor portion 70, it is necessary to set the doping concentration of the region 513 of the second conductivity type in consideration of the characteristics of the transistor portion 70. In this case, if priority is given to the characteristics of the transistor portion 70, the doping concentration of the region 513 of the second conductivity type increases in accordance with the channel of the transistor portion 70, so that a large number of carriers are injected from the region 513 of the second conductivity type during the reverse recovery of the semiconductor device 500, and the switching loss Err increases. Further, when priority is given to the characteristics of the diode portion 80 as in this example, the doping concentration on the edge side of the transistor portion 70 and the diode portion 80 is reduced in accordance with the anode region of the diode portion 80, the carrier extraction efficiency during reverse recovery is lowered, and thee reverse recovery tolerance deteriorates. Thus, in the semiconductor device 500, the characteristics of the transistor portion 70 and the diode portion 80 are not separately optimally designed, and it is difficult to achieve both the conductivity characteristics of the transistor portion 70 and the diode portion 80 and the reverse recovery tolerance.

In contrast, in the semiconductor device 100 according to the first embodiment, by selectively providing the anode region 13 having the lower doping concentration and the first high concentration region 91 having the high doping concentration, a forward voltage Vf of the diode portion 80 is improved and the switching loss Err can be reduced. As described above, the semiconductor device 100 can independently control the conduction characteristics of the transistor portion 70 and the diode portion 80 while suppressing deterioration of the reverse recovery tolerance.

Figure 3A:
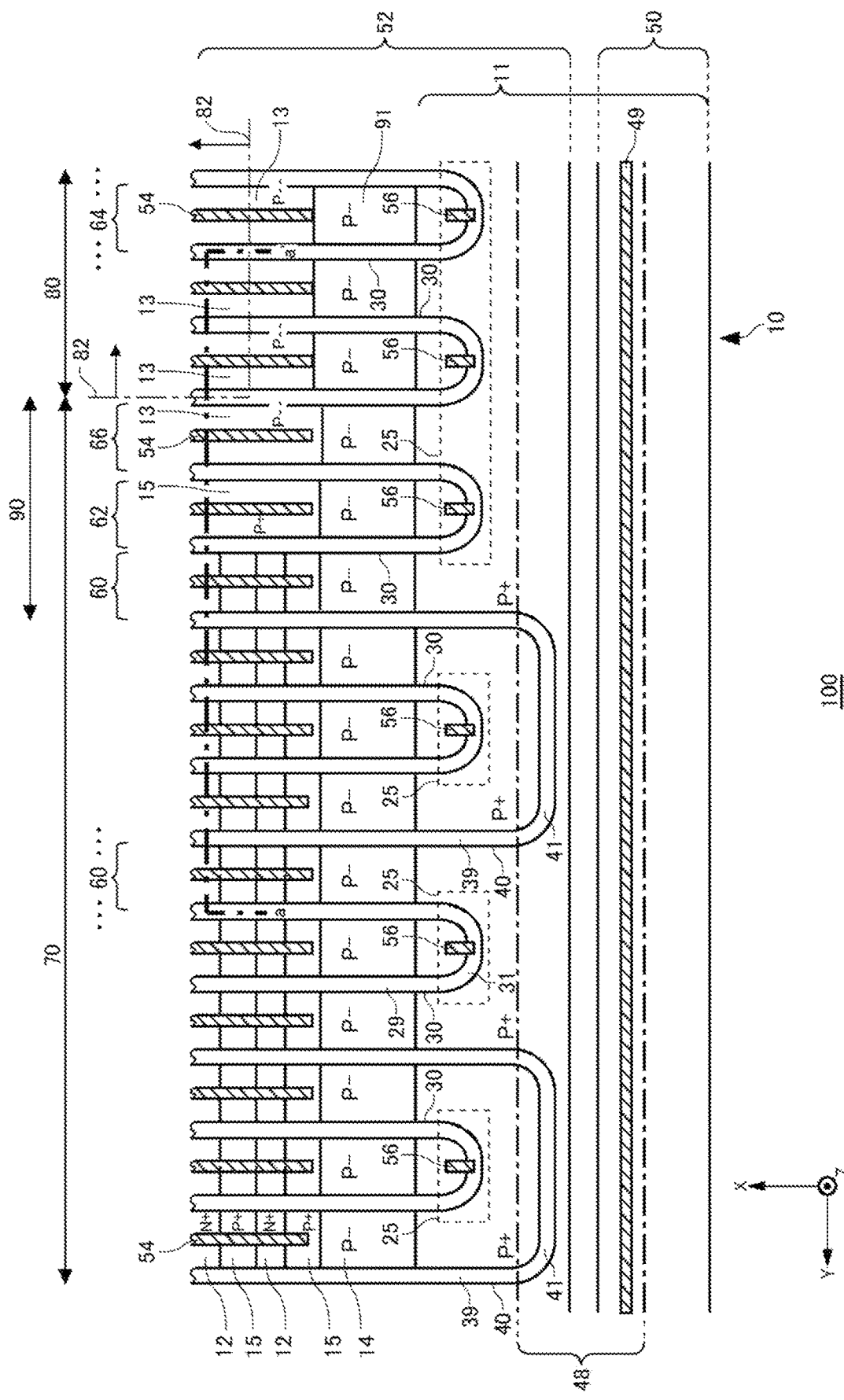
FIG. 3A is an example of a top view of the semiconductor device 100 according to the second embodiment.

FIG. 3A is an example of a top view of the semiconductor device 100 according to the second embodiment. The semiconductor device 100 of this example is different from the semiconductor device 100 according to the first embodiment in the region where the anode region 13 and the first high concentration region 91 are formed.

The length of the anode region 13 extending in the X-axis direction is different from that in the first embodiment. The anode region 13 of this example extends in the X-axis direction so as to be closer to the cathode region 82 than in the case of the first embodiment. The negative end of the X-axis direction of the anode region 13 extends to the same position as the negative end of the X-axis direction in the contact hole 54.

The length of the first high concentration region 91 extending in the X-axis direction is different from that in the first embodiment. The first high concentration region 91 in this example extends to the positive side in the X-axis direction so as to be closer to the cathode region 82 than in the case of the first embodiment. The positive end of the first high concentration region 91 in the X-axis direction extends to the same position as the negative end of the contact hole 54 in the X-axis direction.

That is, the anode region 13 and the first high concentration region 91 of this example extend so as to contact each other in the X-axis direction. Further, the space between the anode region 13 and the first high concentration region 91 is located at the same position as the negative side end of the contact hole 54 in the X-axis direction. Here, the negative end portion of the contact hole 54 in the X-axis direction may be shown as the negative end portion in the X-axis direction of the interface between the conductive member provided inside the contact hole 54 and the semiconductor substrate 10. However, when the sidewall of the contact hole 54 is provided obliquely with respect to the Z axis, not only when the anode region 13 and the first high concentration region 91 are located at the same position as the negative end of the contact hole 54 in the X-axis direction, It may be located at the same position as at least a portion of the sidewall of the contact hole 54.

Further, the anode region 13 is different from the first embodiment in the position extending in the Y-axis direction. The anode region 13 in this example extends to the transistor portion 70 side than in the first embodiment. The positive end of the anode region 13 in the Y-axis direction is provided at the boundary portion 90.

A fourth mesa portion 66 is a mesa portion having the anode region 13 on the upper surface side of the semiconductor substrate 10 at the boundary portion 90. The fourth mesa portion 66 of this example is provided at the end of the diode portion 80 side at the boundary portion 90. However, a plurality of the fourth mesa portions 66 may be provided at the boundary portion 90.

Figure 3B:
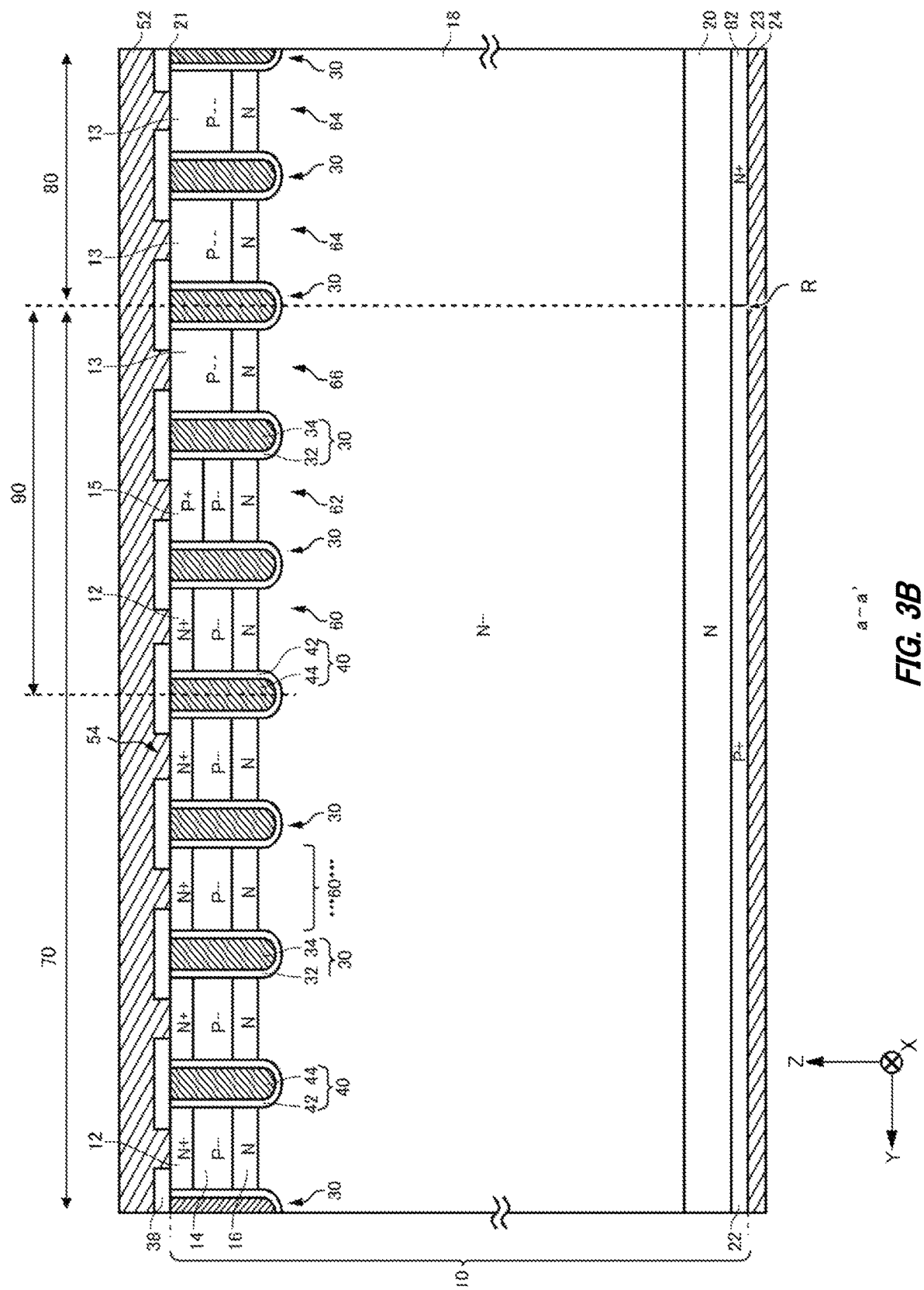
FIG. 3B is an example of an a-a' sectional view of the semiconductor device 100 according to the second embodiment.

FIG. 3B is an example of an a-a' cross-sectional view of the semiconductor device 100 according to the second embodiment. The semiconductor device 100 of this example includes the first mesa portion 60, the second mesa portion 62, and the fourth mesa portion 66 at the boundary 90. As described above, in the semiconductor device 100, the anode region 13 may be formed not only in the diode portion 80 but also in the transistor portion 70.

The anode region 13 extends from the cathode region 82 to the region where the collector region 22 is provided, in the arrangement direction in plane view. That is, the anode region 13 may be provided not only above the cathode region 82 but also above the collector region 22.

In the semiconductor device 100 of this example, the length of the first high concentration region 91 extending in the X-axis direction is longer than that of the first high concentration region 91 according to the first embodiment. Thereby, the reverse recovery tolerance of the semiconductor device 100 can be improved without deteriorating the characteristics of the diode portion 80.

As shown in this example, the position of the anode region 13 in the Y-axis direction toward the transistor portion 70 may be extended toward the transistor portion 70 side than in the first embodiment, or it may be retracted to the diode portion 80 side than the first embodiment. That is, the positive end of the anode region 13 in the Y-axis direction is not in direct contact with the boundary R between the collector region 22 and the cathode region 82, and the first well region 11, the base region 14, and the contact region 15 of the second mesa portion 62 or the first well region 11, the emitter region 12, the base region 14, the contact region 15 of the first mesa portion 60 may be extended to the diode portion 80 side.

Figure 4:
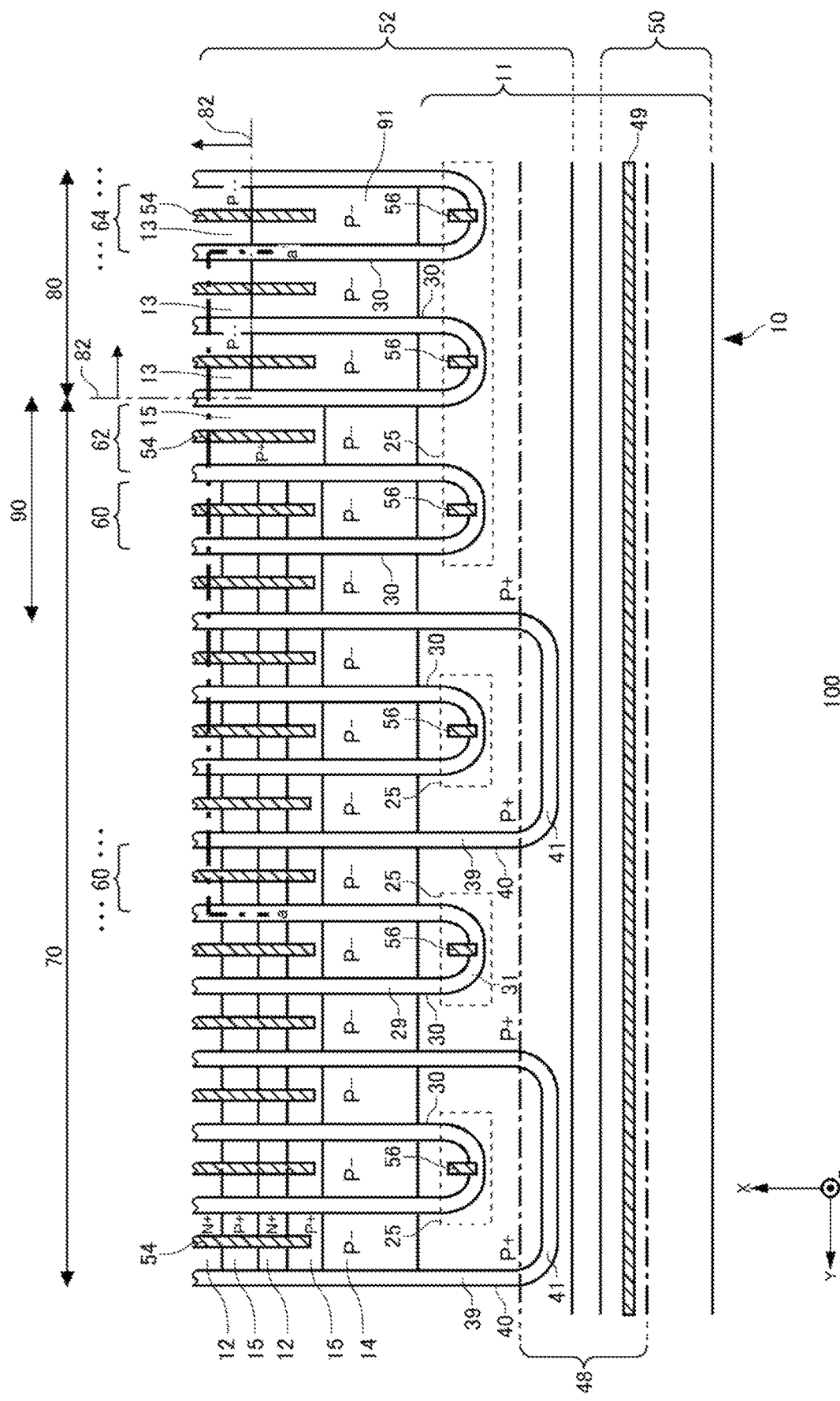
FIG. 4 is an example of a top view of the semiconductor device 100 according to the third embodiment.

FIG. 4 is an example of a top view of the semiconductor device 100 according to the third embodiment. The semiconductor device 100 of this example is different from the semiconductor device 100 according to the first embodiment in the region where the anode region 13 and the first high concentration region 91 are formed. Here, the a-a' cross-sectional view of FIG. 4 may be the same as that shown in FIG. 1B.

The length of the anode region 13 extending in the X-axis direction is different from those in the first and second embodiments. The anode region 13 in this example extends in the X-axis direction so as to be closer to the cathode region 82 than in the case of the first and second embodiments. The negative end of the anode region 13 in the X-axis direction extends up to the same position as the negative end of the cathode region 82 in the X-axis direction in plane view.

The length of the first high concentration region 91 extending in the X-axis direction is different from those in the first and second embodiments. The first high concentration region 91 of the present example extends in the X-axis direction so as to be closer to the cathode region 82 than in the case of the first and second embodiments. For example, the space between the anode region 13 and the first high-concentration region 91 is provided inside the contact hole 54 in the X-axis direction than the negative end of the contact hole 54 in the X-axis direction. Further, in this example, the positive end portion in the X-axis direction in the first high concentration region 91 is extended up to the same position as the negative end portion in the X-axis direction in the cathode region 82 from the outside of the cathode region 82 in plane view.

That is, the anode region 13 and the first high concentration region 91 of this example extend so as to contact each other in the X-axis direction. The first high concentration region 91 in this example is in contact with the anode region 13 at the end of the cathode region 82. That is, the anode region 13 and the first high concentration region 91 are located at the same position as the negative end of the cathode region 82 in the X-axis direction.

Note that the anode region 13 of this example is the same as that of the first embodiment in the position of extending in the Y-axis direction. That is, the anode region 13 is provided in the diode portion 80 and is not provided in the transistor portion 70. However, the anode region 13 may be provided extending from the diode portion 80 to the transistor portion 70 as in the second embodiment.

In the semiconductor device 100 according to this example, the space between the anode region 13 and the first high concentration region 91 is in the same position as the end of the cathode region 82, in the extending direction in plane view, thereby, the range of the first high concentration region 91 is wider than that of the semiconductor device 100 according to the first and second embodiments. On the other hand, in the semiconductor device 100 of this example, although the region where the anode region 13 is provided becomes narrow, the influence on the characteristics of the diode portion 80 is small. Thereby, the reverse recovery tolerance of the semiconductor device 100 can be improved without deteriorating the characteristics of the diode portion 80.

In the first to third embodiments, the relationship between the position between the anode region 13 and the first high concentration region 91 and the contact hole 54 and the cathode region 82 is changed. However, the relationship between the position the anode region 13 and the first high concentration region 91 and the contact hole 54 and the cathode region 82 is not limited to the relationship in the first to third embodiments. For example, even if the position between the anode region 13 and the first high concentration region 91 is outside the end portion of the contact hole 54 as in the first embodiment, the position between the anode region 13 and the first high concentration region 91 may be as the same as the cathode region 82 as in the third embodiment. In this case, the cathode region 82 is provided outside the end portion of the contact hole 54. Thus, the position between the anode region 13 and the first high concentration region 91 and the relationship between the contact hole 54 and the cathode region 82 may be freely changed.

Specifically, in the present embodiment, the space between the anode region 13 and the first high concentration region 91 (or a second high concentration region 92 described later) may be arranged inside the cathode region 82, may be arranged outside or may be arranged at substantially the same position. Further, the space between the anode region 13 and the first high concentration region 91 (or the second high concentration region 92 described later) may be arranged inside than the end portion of the contact hole 54 or may be arranged outside, or alternatively, or may be arranged at substantially the same position as the end of the contact hole 54. Further, the cathode region 82 may be arranged inside than the end portion of the contact hole 54, may be arranged outside or may be arranged at substantially the same position as the end portion of the contact hole 54.

Figure 5:
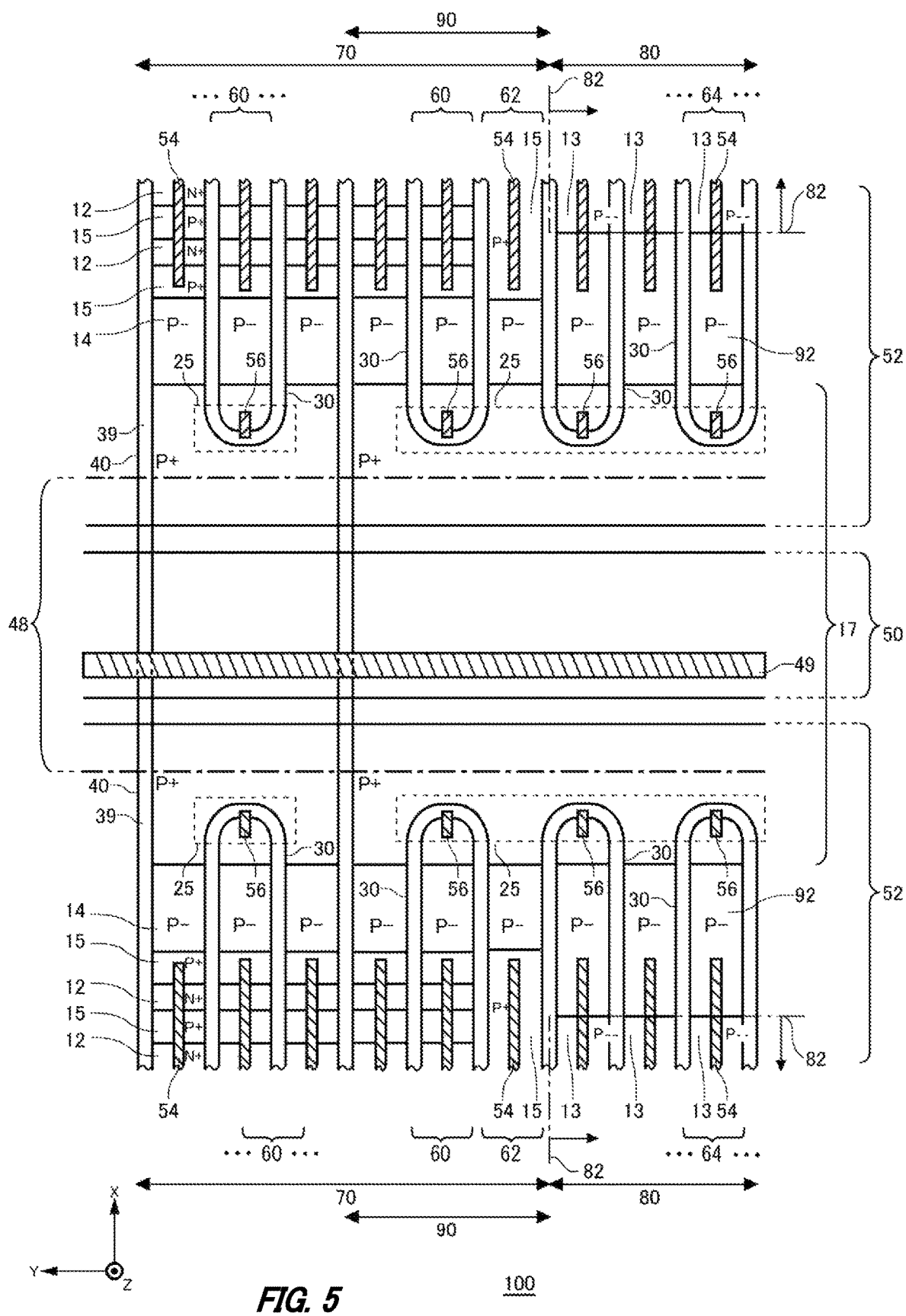
FIG. 5 shows an example of a top view of the periphery of the gate runner 48.

FIG. 5 shows an example of a top view around the gate runner 48. The semiconductor device 100 of this example further includes a second high concentration region 92. The semiconductor device 100 includes one or more transistor portions 70 and one or more diode portions 80.

The second well region 17 is a region of the second conductivity type provided on the upper surface side of the semiconductor substrate 10. The second well region 17 is P+ type as one example. The second well region 17 may have the same doping concentration as the first well region 11. The second well region 17 is provided between any of one or more transistor portions 70 and one or more diode portions 80. That is, the second well region 17 may be provided between the transistor portion 70 and the diode portion 80, may be provided between the transistor portions 70 or may be provided between the diode portions 80.

The second high concentration region 92 is provided in contact with the second well region 17. The second high concentration region 92 is a region of the second conductivity type having a higher doping concentration than the anode region 13. The second high concentration region 92 has P− type as one example. The second high concentration region 92 may have the same doping concentration as the first high concentration region 91. For example, the dose amount of the second high concentration region 92 is $2.0 \times 10^{13}/cm^2$ to $3.0 \times 10^{13}/cm^2$. Further, the thickness of the second high concentration region 92 may be the same as the thickness of the first high concentration region 91. In other words, the second high concentration region 92 may be provided by the same process as the first high concentration region 91.

The semiconductor device 100 of this example includes not only the first high concentration region 91 provided on the edge side of the semiconductor device 100 but also the second high concentration region 92 provided inside the active region. Thereby, the semiconductor device 100 can suppress deterioration of the carrier extraction efficiency during reverse recovery not only on the edge side but also inside in the active region. Thereby, the reverse recovery tolerance of the semiconductor device 100 is further improved.

Figure 6:
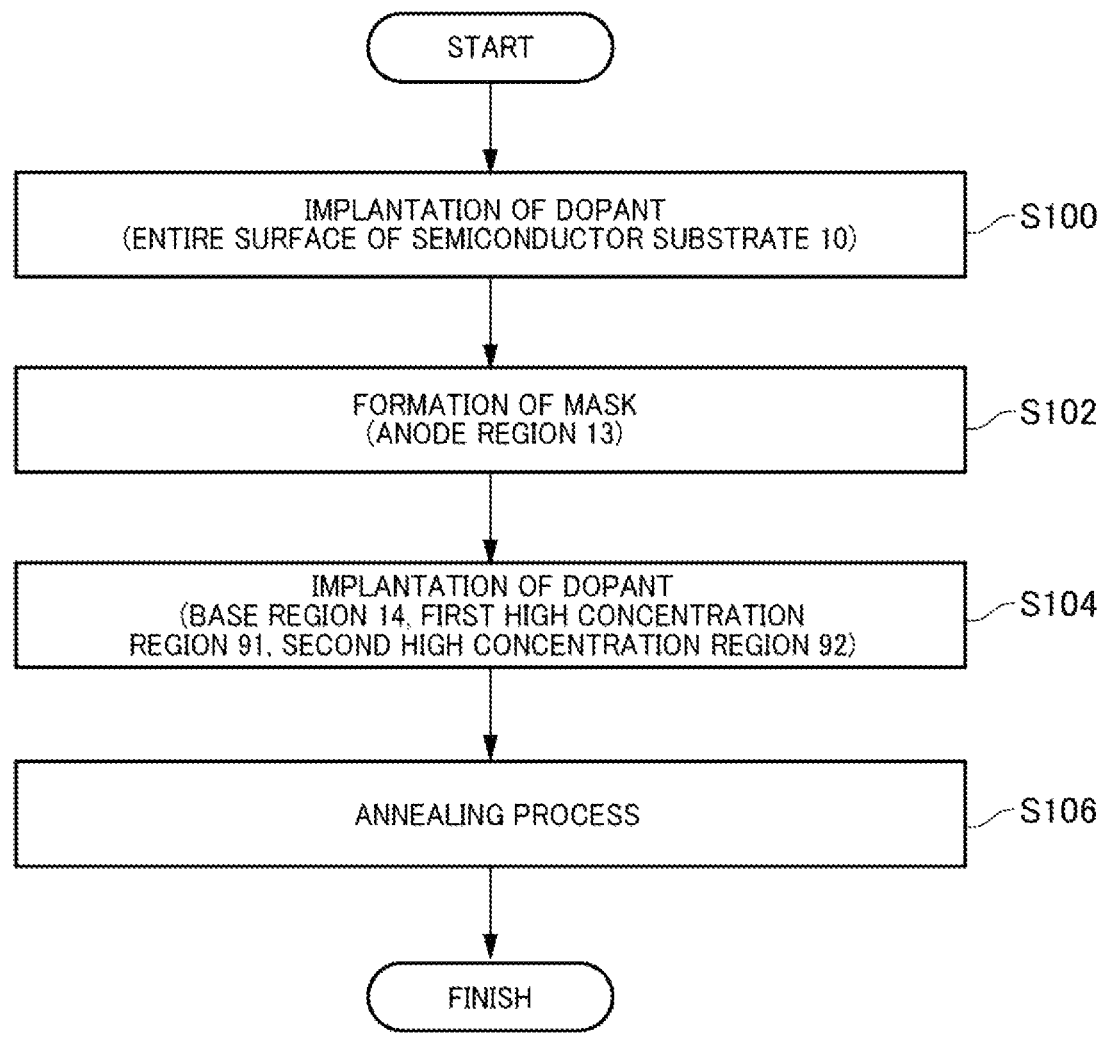
FIG. 6 shows an example of a manufacturing method of the semiconductor device 100.

FIG. 6 shows an example of a manufacturing method of the semiconductor device 100. This figure shows a dopant implantation step and an annealing step for forming the anode region 13, the base region 14, and the first high concentration region 91.

In this example, a dopant is implanted into the entire surface of the semiconductor substrate 10 (step S100). For example, P-type dopant is implanted into the entire surface of the semiconductor substrate 10 at a dose amount of $1.0 \times 10^{13}/cm^2$ to $2.0 \times 10^{13}/cm^2$. An example of the P-type dopant is boron. The dopant implantation process of this example does not require a process of forming a mask in advance.

Next, a mask is formed only on the anode region 13 (step S102). With the mask formed in the anode region 13, P-type dopant is implanted into the region of the semiconductor substrate 10 where the base region 14, the first high concentration region 91, and the second high concentration region 92 are to be formed (step S104). The P type dopant in this example may be the same as the P type dopant implanted in Step S100. In step S104, the dopant is implanted until the sum of the doping concentration implanted in step S100 reaches a predetermined doping concentration of the base region 14, the first high concentration region 91, and the second high concentration region 92. For example, the total dose amount of the base region 14, the first high concentration region 91, and the second high concentration region 92 is $2.0 \times 10^{13}/cm^2$ to $3.0 \times 10^{13}/cm^2$.

Thereafter, an annealing process is performed (step S106). Thereby, the dopant injection into the anode region 13 can be suppressed, and the doping concentration of the anode region 13 can be made lower than that of the base region 14 and the first high concentration region 91.

Figure 7:
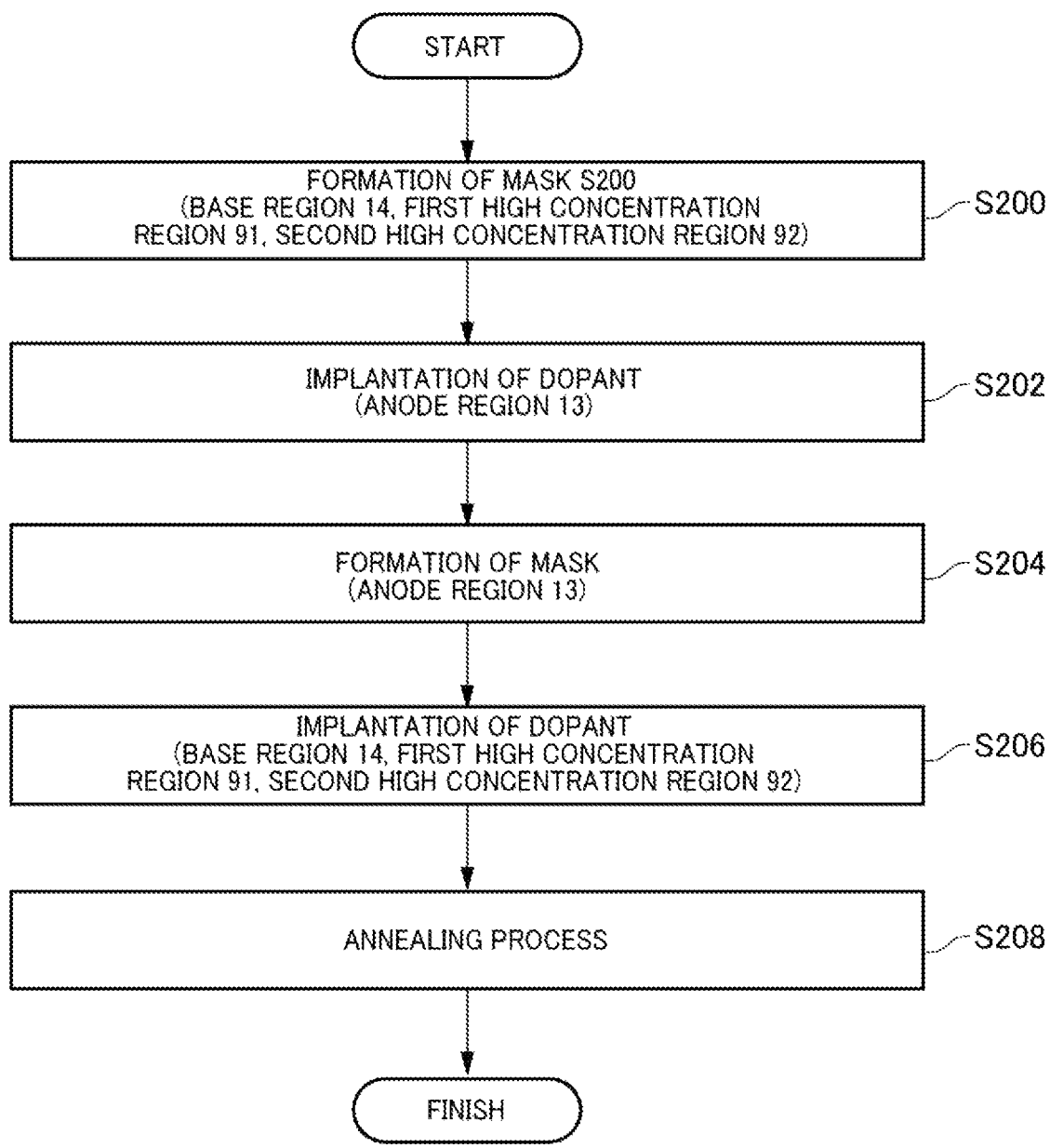
FIG. 7 shows another example of the manufacturing method of the semiconductor device 100.

FIG. 7 shows another example of the method for manufacturing the semiconductor device 100. This figure shows a dopant implantation step and an annealing step for forming the anode region 13, the base region 14, and the first high concentration region 91.

In this example, masks are formed in the base region 14, the first high concentration region 91, and the second high concentration region 92 (step S200). Next, with a mask formed in the base region 14, the first high concentration region 91, and the second high concentration region 92, the P type dopant is implanted into the region of the semiconductor substrate 10 where the anode region 13 is to be formed (step S202). Next, a mask is formed only on the anode region 13 (step S204). Then, the P type dopant is implanted into the base region 14, the first high concentration region 91, and the second high concentration region 92 (step S206). Thereafter, an annealing process is performed (step S208). Thereby, the doping concentration of the anode region 13 and the doping concentration of the base region 14 and the first high concentration region 91 can be individually set.

In this example, after the dopant is implanted into the anode region 13, the dopant is implanted into the base region 14, the first high concentration region 91, and the second high concentration region 92, but after the dopant is implanted into the base region 14, the first high concentration region 91, and the second high concentration region 92, the dopant may be implanted into the anode region 13. In this example, the base region 14, the first high concentration region 91, and the second high concentration region 92 are formed by the same dopant implantation process; however, the base region 14, the first high concentration region 91 and the second high-concentration region 92 may be formed by different dopant implantation steps by forming masks for the first concentration region 91 and the second concentration region 92, respectively. In this case, the doping concentration of the anode region 13 and the doping concentration of the base region 14 and the first high concentration region 91 can be set to different doping concentrations.

FIG. 6 and FIG. 7 show the dopant implantation step and the annealing step for forming the anode region 13, the base region 14, and the first high concentration region 91, but thereafter or during that time, using a well-known method, Other configurations such as an emitter region, a contact region, and a well region are formed.

Figure 8:
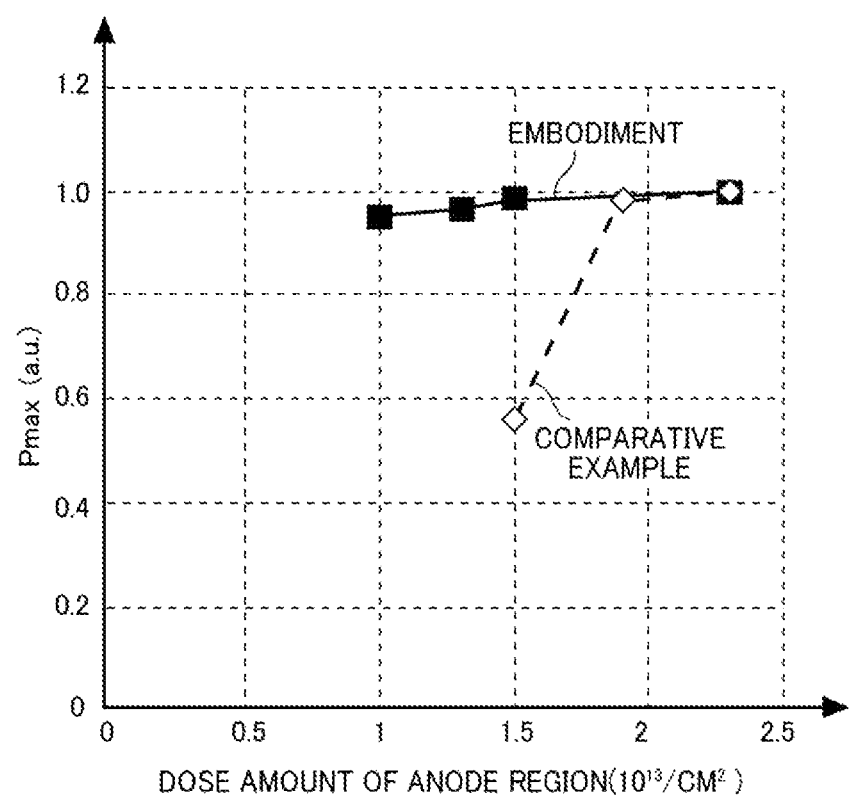
FIG. 8 shows a graph comparing a reverse recovery tolerance of the semiconductor device 100 and the semiconductor device 500.

FIG. 8 shows a graph comparing the reverse recovery tolerance of the semiconductor device 100 and the semiconductor device 500. The vertical axis represents the reverse recovery tolerance Pmax (au), and the horizontal axis represents the dose amount ($10^{13}/cm^2$) of the anode region of the diode portion 80. A solid line indicates the reverse recovery tolerance of the semiconductor device 100. A broken line indicates the reverse recovery tolerance of the semiconductor device 500.

The semiconductor device 100 according to the example includes an anode region 13 and a first high concentration region 91 having a higher doping concentration than that of the anode region 13 and the anode region 13 in the diode portion 80. The semiconductor device 500 according to the comparative example includes the second conductivity type region 513 having a uniform doping concentration and a low doping concentration.

The semiconductor device 100 can maintain the same doping concentration as that of the base region 14 in the first high concentration region 91 even when the dose of the anode region 13 is reduced. Therefore, the reverse recovery tolerance of the semiconductor device 100 does not deteriorate.

On the other hand, when the dose of the diode portion to the anode region of the semiconductor device 500 is reduced, the entire dose amount is increased to the edge of the diode portion 80 in contact with the first well region 11 or the second well region 17. Therefore, the reverse recovery tolerance of the semiconductor device 500 deteriorates.

As mentioned above, although this invention was explained using embodiments, the technical scope of this invention is not limited to the range as described in the above-described embodiment. It will be apparent to those skilled in the art that various modifications or improvements can be added to the above-described embodiment. It is apparent from the scope of the claims that the embodiments added with such changes or improvements can be included in the technical scope of the present invention.

The execution order of each process such as operations, procedures, steps, and stages in the apparatus, system, program, and method shown in the claims, the description, and the drawings is not explicitly stated "before" or "prior". It should be noted that they can be implemented in any order unless the output of the previous process is used in the subsequent process. Regarding the operation flow in the claims, the description, and the drawings, even if it is described using "first", "next", etc. for the sake of convenience, it does not mean that it is essential to carry out in this order.

EXPLANATION OF REFERENCE SYMBOLS

10: Semiconductor substrate; 11: First well region; 12: Emitter region; 13: Anode region; 14: Base region; 15: Contact region; 16: Storage region 17: Second well region; 18: Drift region; 20: Buffer region; 21: Upper surface; 22: Collector region; 23: Lower surface; 24: Collector electrode; 25: Connection portion; 29: Extension portion; 30: Dummy trench portion; 31: Connection portion; 32: Dummy insulating film; 34: Dummy conductive portion; 38: Interlayer dielectric film; 39: Extension portion; 40: Gate trench portion; 41: Connection portion; 42: Gate insulating film; 44: Gate conductive portion; 48: Gate runner; 49 . . . Contact holes; 50: Gate metal layer; 52: Emitter electrode; 54: Contact hole; 56: Contact hole; 60: First mesa portion; 62: Second mesa portion; 64: Third mesa portion; 66: Fourth mesa portion; 70: Transistor portion; 80: Diode portion; 82: Cathode region; 90: Boundary portion; 91: First high concentration region; 92: Second high concentration region; 100: Semiconductor device; 500: Semiconductor device; 513: Second conductivity type region

What is claimed is:

1. A semiconductor device having a transistor portion and a diode portion, the diode portion comprising:
   a first well region of a second conductivity type that forms part of the upper surface of a semiconductor substrate;
   an anode region of a second conductivity type that forms part of the upper surface of the semiconductor substrate; and
   a first high concentration region of a second conductivity type, that forms part of the upper surface of the semiconductor substrate,
   wherein the first high concentration region fully separates the first well region and the anode region,
   wherein the first high concentration region is provided between the anode region and the first well region, and
   wherein the first high concentration region has a higher doping concentration than the anode region.

2. The semiconductor device according to claim 1, wherein the first high concentration region is provided in a mesa portion of the semiconductor substrate sandwiched between trench portions.

3. The semiconductor device according to claim 1, wherein the transistor portion has a base region of the second conductivity type provided on the upper surface side of the semiconductor substrate, and
   the doping concentration of the anode region is lower than the doping concentration of the base region.

4. The semiconductor device according to claim 3, wherein the doping concentration of the first high concentration region is same as the doping concentration of the base region.

5. The semiconductor device according to claim 1, further comprising:
   an interlayer dielectric film provided above the upper surface of the semiconductor substrate; and
   an emitter electrode provided above the interlayer dielectric film, wherein
   the interlayer dielectric film is provided with one or more contact holes to electrically connect the emitter electrode and the semiconductor substrate, and
   no contact hole is provided at the upper surface of the first high concentration region to electrically connect the emitter electrode and the semiconductor substrate.

6. The semiconductor device according to claim 1, further comprising:
   an interlayer dielectric film provided above the upper surface of the semiconductor substrate; and
   an emitter electrode provided above the interlayer dielectric film, wherein the interlayer dielectric film is provided with one or more contact holes to electrically connect the emitter electrode and the semiconductor substrate, the one or more contact holes are provided extending in the extending direction of a plurality of trench portions included in the transistor portion, and
   a space between the anode region and the first high concentration region is located outside the end of the extending direction of the one or more contact holes in the diode portion, in the extending direction in a plane view.

7. The semiconductor device according to claim 1, further comprising:
   an interlayer dielectric film provided above the upper surface of the semiconductor substrate; and
   an emitter electrode provided above the interlayer dielectric film, wherein
   the interlayer dielectric film is provided with one or more contact holes to electrically connect the emitter electrode and the semiconductor substrate,
   the one or more contact holes are provided extending in the extending direction of a plurality of trench portions included in the transistor portion, and
   a space between the anode region and the first high concentration region is located at a same position as the end of the extending direction of the one or more contact holes in the diode portion, in the extending direction in a plane view.

8. The semiconductor device according to claim 1, further comprising:
   an interlayer dielectric film provided above the upper surface of the semiconductor substrate; and
   an emitter electrode provided above the interlayer dielectric film, wherein the interlayer dielectric film is provided with one or more contact holes to electrically connect the emitter electrode and the semiconductor substrate,
   the one or more contact holes are provided extending in the extending direction of a plurality of trench portions included in the transistor portion, and
   a space between the anode region and the first high concentration region is located inside the extending direction end of the one or more contact holes in the diode portion, in the extending direction in a plane view.

9. The semiconductor device according to claim 1, wherein the diode portion includes a cathode region in contact with a lower surface side of the semiconductor substrate, and
   a space between the anode region and the first high concentration region is located outside the cathode region in the extending direction in a plane view of a plurality of trench portions.

10. The semiconductor device according to claim 1, wherein the diode portion includes a cathode region in contact with a lower surface side of the semiconductor substrate, and
    a space between the anode region and the first high concentration region is located at a same position as an end of the cathode region, in the extending direction in a plane view of a plurality of trench portions.

11. The semiconductor device according to claim 1, wherein the transistor portion includes a collector region in contact with a lower surface side of the semiconductor substrate,
    the diode portion includes a cathode region provided on the lower surface side of the semiconductor substrate, and
    the anode region has an end portion at a same position as a boundary between the cathode region and the collector region in an arrangement direction of a plurality of trench portions included in the transistor portion in a plane view.

12. The semiconductor device according to claim 1,
wherein the transistor portion includes a collector region in contact with a lower surface side of the semiconductor substrate, and
the anode region extends from the diode portion to a region where the collector region is provided in a plane view.

13. The semiconductor device according to claim 1, further comprising:
one or more transistor portions and one or more diode portions;
a second well region of a second conductivity type that forms part of the upper surface of the semiconductor substrate, and is between any of the one or more transistor portions and the one or more diode portions; and
a second high concentration region of a second conductivity type, that forms part of the upper surface of the semiconductor substrate, provided in contact with the second well region and having a higher doping concentration than the anode region.

14. The semiconductor device according to claim 13, wherein the second high concentration region has a same doping concentration as the first high concentration region.

* * * * *